(12) United States Patent
Ternullo, Jr. et al.

(10) Patent No.: US 7,102,421 B1
(45) Date of Patent: *Sep. 5, 2006

(54) DYNAMICALLY ADJUSTABLE ON-CHIP SUPPLY VOLTAGE GENERATION

(75) Inventors: Luigi Ternullo, Jr.; Michael C. Stephens, Jr., both of San Jose, CA (US)

(73) Assignee: Vanguard International Semiconductor Corporation, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/064,884

(22) Filed: Apr. 20, 1998

(51) Int. Cl.
*G05F 1/10* (2006.01)

(52) U.S. Cl. ............ 327/535; 327/536; 327/540; 327/68; 323/274; 323/275

(58) Field of Classification Search .......... 327/77, 327/78, 81, 534, 535, 68, 74, 536, 537, 540; 323/273, 274, 275
See application file for complete search history.

(56) References Cited

U.S. PATENT DOCUMENTS

| | | | | |
|---|---|---|---|---|
| 5,329,168 A | * | 7/1994 | Sugibayashi et al. | 327/535 |
| 5,475,333 A | * | 12/1995 | Kumagai | 327/530 |
| 5,532,620 A | * | 7/1996 | Seo et al. | 326/81 |
| 5,612,630 A | * | 3/1997 | Wright et al. | 326/22 |
| 5,656,944 A |   | 8/1997 | Choi | |
| 5,844,429 A | * | 12/1998 | Cho | 327/68 |
| 5,864,247 A | * | 1/1999 | Hirano et al. | 327/143 |
| 5,920,226 A | * | 7/1999 | Mimura | 327/537 |
| 6,016,072 A | * | 1/2000 | Ternullo, Jr. et al. | 327/535 |

* cited by examiner

*Primary Examiner*—Timothy P. Callahan
*Assistant Examiner*—An T. Luu
(74) *Attorney, Agent, or Firm*—J.C. Patents

(57) ABSTRACT

A voltage regulation scheme for an on-chip voltage generator includes a voltage sensing circuit (VSC) and a configurable buffer circuit (CBC) to regulate the on-chip voltage generator. The CBC generates an output signal that is received by the on-chip voltage generator to activate and de-activate the voltage generator. The VSC generates a voltage level detection (VLD) signal having a voltage level that is a function of the level of the on-chip generated voltage. The CBC receives a control signal that is used to dynamically configure the chip into an operational mode, as well as the VLD signal. In response to the control signal, the switch threshold of the CBC is configured to a predetermined level corresponding to the selected operational mode. The predetermined trip point causes the CBC to appropriately activate and de-activate the on-chip voltage generator to regulate the on-chip generated voltage at the level required by the configured operational mode. One embodiment of the CBC uses a configurable pull-up circuit to alter its switch threshold or trip point. The configurable pull-up circuit is used to pull-up the voltage at an intermediate node that is buffered and propagated to the on-chip voltage generator to activate and de-activate the voltage generator. The configurable pull-up circuit more strongly pulls up this voltage in one operational mode compared to another operational mode to alter the switch threshold.

24 Claims, 6 Drawing Sheets

DYNAMICALLY ADJUSTABLE ON-CHIP SUPPLY VOLTAGE GENERATION

FIELD OF THE INVENTION

The present invention relates to integrated circuits and, more particularly, to on-chip voltage generators for integrated circuits. Still more particularly, the present invention is related to voltage generators that can be adjusted for different operational modes.

BACKGROUND

Many integrated circuits (commonly referred to as "chips") have more than one operational mode. For example, the chip may have a normal mode during which the chip performs the normal functions for which the chip was designed; e.g., in a memory chip, the normal mode might be to process memory access requests. In addition, the chip may have test modes in which the chip is tested to determine whether the chip is functioning properly. One test mode is commonly referred to as "burn-in". The burn-in mode is a reliability test mode during which the chip is operated while "stressed" to a degree that is greater than expected in normal operating conditions. For example, a chip might be stressed in a burn-in test by heating the chip to a relatively high temperature while powering the chip with a relatively high supply voltage VDD. Burn-in mode is commonly used to find chips that would most likely fail after a short period of use. Hereinafter, the level or value of supply voltage VDD during normal mode will be referred to as $VDD_N$ and during burn-in mode as $VDD_{BI}$.

However, burn-in modes may damage otherwise good chips that have on-chip voltage generators. In particular, some chips have on-chip voltage generators that provide a negative supply voltage used to "back-bias" a substrate so as to control the threshold voltage Vtn of N-channel field effect transistors (NFETs). This negative supply voltage is commonly referred to as the VBB supply voltage. The negative substrate supply voltage VBB together with supply voltage VDD being at the higher burn-in level $VDD_{BI}$ may result in some transistor devices being subjecting to voltages exceeding the devices' breakdown voltage, thereby damaging these devices. Still further, some chips also have an on-chip voltage generator providing a boosted supply voltage having a level of about a volt higher than supply voltage VDD. Thus, the boosted supply voltage can further exacerbate the breakdown voltage problem.

One conventional solution to this problem is shown in FIG. 1 in which the level of negative supply voltage VBB is adjusted to a less negative value $VBB_{BI}$ during burn-in mode. This scheme reduces the difference between $VDD_{BI}$ and $VBB_{BI}$ to a value that is less than the breakdown voltage of the devices in the chip.

Conventional system 10 includes a normal mode section implemented by a voltage sensing circuit (VSC) 11 and a buffer circuit 12. VSC 11 has an output lead connected to an input lead of buffer circuit 12, which has an output lead that is connected to an input lead of a multiplexer 13. VSC 11 is configured to detect whether the supply voltage VBB has reached a predetermined normal mode VBB threshold. The normal mode VBB threshold is typically set to about –VDD/2, where VDD is the value of the VDD supply voltage. When the level of negative supply voltage VBB reaches the normal mode VBB threshold, VSC 11 asserts a voltage level detect signal $VLD_N$, which is propagated by buffer circuit 12 to multiplexer 13.

System 10 also includes a burn-in section implemented by burn-in VSC 15 and a buffer circuit 16, which is also connected to multiplexer 13. VSC 15 is configured to detect whether the level of negative supply voltage VBB has reached a predetermined burn-in mode VBB threshold. The burn-in mode VBB threshold is set to a level that is less negative than the normal mode VBB threshold. When the level of supply voltage VBB reaches the burn-in mode VBB threshold, VSC 15 asserts a voltage level detect signal $VLD_{BI}$, which is propagated by buffer circuit 16 to multiplexer 13.

Multiplexer 13 has an output lead connected to a charge pump (CP) 19 and a select lead connected to receive a burn-in control signal BI. Typically, signal BI is provided from an on-chip test mode register (not shown) that is loaded by an external tester (not shown). Signal BI is asserted to configure system 10 into the burn-in mode. Alternatively, on-chip detection circuitry may be used to detect when the supply voltage is at the burn-in mode level and assert signal BI.

FIG. 2 is a timing diagram illustrative of the operation of system 10 when initially powered up. The level of supply voltage VBB is represented by a waveform 21, with control signal BI being represented by a waveform 23. Voltage level detection signals $VLD_N$, $VLD_{BI}$ and $VLD_O$ are respectively represented by waveforms 25, 27 and 29. In this embodiment, VSCs 11 and 15 are voltage divider type VSCs. Consequently, signals $VLD_N$ and $VLD_{BI}$ are analog signals, but for clarity are shown as digital signals in FIG. 2. In this example, system 10 uses a three volt VDD supply voltage, with normal mode and burn-in mode VBB thresholds being about –1.5 volts and –1.0 volts, respectively.

Referring to FIGS. 1 and 2, in this example the chip is powered up in burn-in mode. Because initially the value of supply voltage VBB is about zero volts, VSCs 11 and 15 de-assert signals $VLD_N$ and $VLD_{BI}$ (i.e., at logic high levels). During the burn-in mode, signal BI is asserted (i.e., at a logic high level), thereby causing multiplexer 13 to select the output signal from buffer circuit 16. Consequently, signal $VLD_{BI}$ essentially serves as signal $VLD_O$ during burn-in mode. The logic high level of signal $VLD_O$ activates charge pump 19 to begin negatively increasing the level of VBB supply voltage. Thus, initially, waveform 21 has a negative slope, negatively increasing from about zero volts as indicated by arrow $21_1$.

When the level of supply voltage VBB reaches –1.0 volts (i.e., the burn-in mode VBB threshold), VSC 15 asserts the active low signal $VLD_{BI}$, thereby causing signal $VLD_O$ to transition to a logic low level, as indicated by arrows $21_2$ and $27_1$. The logic low level of signal $VLD_O$ de-activates charge pump 19, causing the level of supply voltage VBB to stabilize at about –1 volt as indicated by arrow $21_3$.

Conversely, when signal BI is de-asserted to configure the chip into the normal mode, multiplexer 13 selects signal $VLD_N$ (generated by VSC 11 and buffered by buffer circuit 12) to serve as output voltage level detection signal $VLD_O$. As described above, VSC 11 de-asserts the active low signal $VLD_N$ when the level of negative supply voltage VBB is less negative than the normal mode VBB threshold. Thus, when signal BI is de-asserted, signal $VLD_O$ is also de-asserted as indicated by arrow $23_1$ because the normal mode VBB threshold is more negative than the burn-in mode VBB threshold. Consequently, charge pump 19 is activated, causing the level of negative supply voltage VBB to negatively increase as indicated by arrow $21_4$.

When the level of negative supply voltage VBB reaches the normal mode VBB threshold, VSC 11 asserts signal $VLD_N$ causing signal $VLD_O$ to also be asserted, as indicated by arrows $21_5$ and $25_1$. As a result, charge pump 19 is de-activated, allowing the level of negative supply voltage VBB to stabilize at about the normal mode VBB threshold of about −1.5 volts as indicated by arrow $21_6$. However, one problem with this conventional approach is that the separate burn-in section occupies a relatively large portion of chip area that could be used for other circuitry. Thus, there is a need for an approach that provides normal mode and burn-in mode VBB threshold detection while occupying minimal area on the chip.

SUMMARY

In accordance with the present invention, a voltage regulation scheme for an on-chip voltage generator is provided that is configurable to support different operational modes that require the on-chip generated voltage to be different for each operational mode. One embodiment includes a voltage sensing circuit (VSC) and a configurable buffer circuit (CBC) to regulate the on-chip voltage generator. The CBC generates an output signal that is received by the on-chip voltage generator to activate and de-activate the voltage generator. The VSC generates a voltage level detection (VLD) signal having a voltage level that is a function of the level of the on-chip generated voltage.

More specifically, the CBC is connected to receive a control signal that is used to configure the chip into an operational mode, as well as to receive the VLD signal. In response to the control signal, the switch threshold or trip point of the CBC is configured to a predetermined level corresponding to the selected operational mode. In particular, a trip point is predetermined for each operational mode so that the CBC will appropriately activate and de-activate the on-chip voltage generator to regulate the on-chip generated voltage at the level required by that operational mode. This configurable on-chip voltage regulation scheme advantageously requires less circuitry than the aforementioned conventional scheme, thereby reducing the chip area occupied by the regulator circuitry. In addition, this scheme reduces power consumption by eliminating a VSC, which can dissipate a relatively large amount of power.

In one aspect of the present invention, the CBC uses a configurable pull-up circuit to alter its switch threshold or trip point. The configurable pull-up circuit is used to pull-up the voltage at an intermediate node that is then buffered and propagated to the on-chip voltage generator to activate and de-activate the voltage generator. In one operational mode, the configurable pull-up circuit more strongly pulls up this voltage compared to another operational mode, thereby altering the switch threshold. In another aspect of the present invention, the CBC uses a configurable pull-down circuit to achieve a similar result.

DETAILED DESCRIPTION

Figure 3:
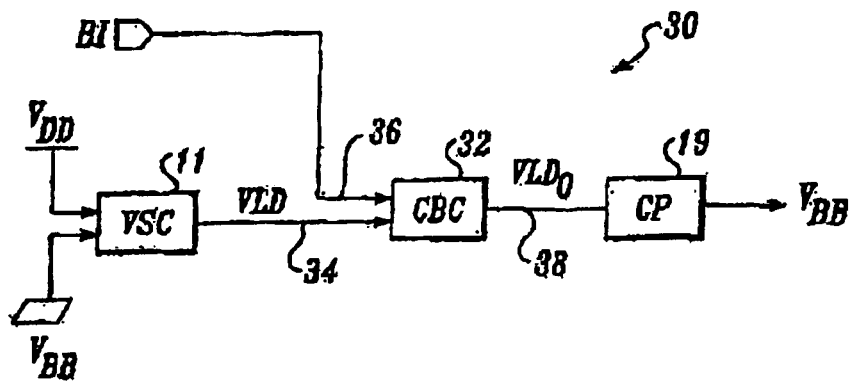
FIG. 3 is a functional block diagram illustrative of a dynamically adjustable on-chip voltage generator system, according to one embodiment of the present invention.

FIG. 3 is a functional block diagram illustrative of a dynamically adjustable on-chip voltage generator system 30, according to one embodiment of the present invention. For clarity, the same reference numbers are used between drawings to indicate elements having the same or similar function or structure. System 30 includes VSC 11, charge pump 19 and a configurable buffer circuit (CBC) 32. As in system 10, VSC 11 is configured to detect when negative supply voltage VBB reaches the normal mode VBB threshold. VSC 11 generates at a lead 34 an output signal VLD, which has a voltage that is a function of the level of negative supply voltage VBB. In particular, VSC 11 is configured to generate signal VLD so that when the negative supply voltage reaches the normal mode VBB threshold, signal VLD ideally has a value equal to the normal mode switch threshold or trip point of CBC 32. In this embodiment, signal VLD is essentially proportional to the magnitude of negative supply voltage VBB.

CBC 32 has an input terminal connected to lead 34, a control terminal connected to receive signal BI through a lead 36 and an output terminal connected to charge pump 19 through a lead 38. In accordance with the present invention, in response to control signal BI, CBC 32 has a switch threshold or trip point that is dynamically configurable into a normal mode trip point or a burn-in mode trip point. As used herein, the terms "switch threshold" or "trip point" refer to a voltage level that CBC 32, in effect, compares to the voltage level of the input signal. If the voltage level of the input signal is below the trip point, CBC 32 detects the input signal as having a logic low level and, conversely, if the voltage level of the input signal is above the trip point, CBC 32 detects the input signal as having a logic high level.

As described above, VSC 11 generates signal VLD to have a voltage level proportional to the value of negative supply voltage VBB. The normal mode trip point of CBC 32 is predetermined so that CBC 32 will transition or switch when the levels of supply voltages VBB and VDD are respectively equal to about −1.5 volts and the normal mode VDD level (e.g., 3.3 volts). In contrast, the burn-in mode switch level is predetermined so that CBC 32 will switch when the levels of supply voltages VBB and VDD are respectively equal to about −1 volts and the burn-in mode VDD level (e.g., 5.5 volts). These switch thresholds for CBC 32 are described below in more detail in conjunction with FIG. 4.

Figure 4:
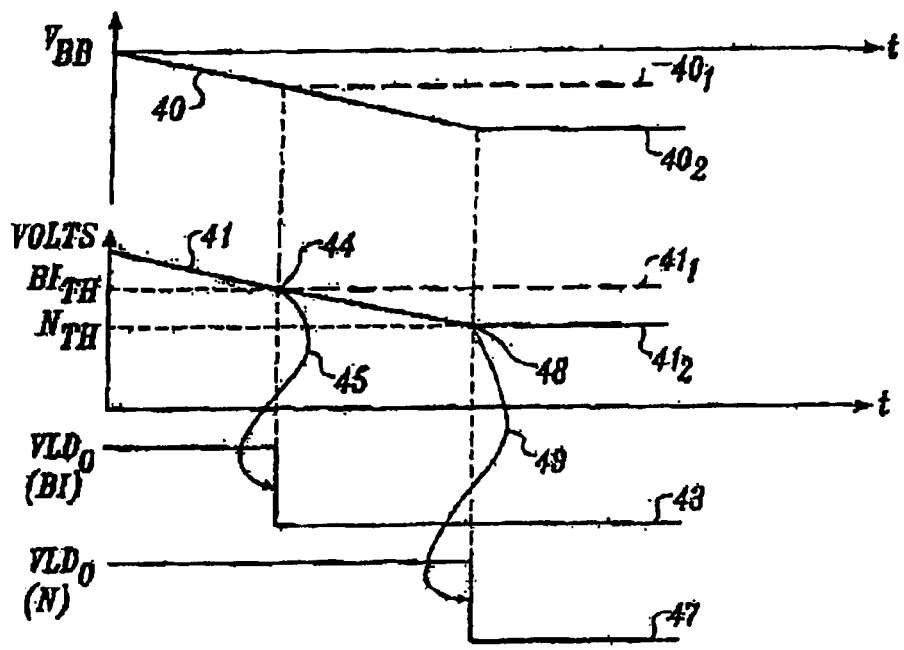
FIG. 4 is a timing diagram illustrative of the switch threshold levels of a dynamically configurable buffer circuit (CBC) according to one embodiment of the present invention.

FIG. 4 is a timing diagram illustrative of the switch threshold levels of CBC 32 (FIG. 3), according to one embodiment of the present invention. The voltage levels of supply voltage VBB and signal VLD are represented by waveforms 40 and 41, respectively. As described above in conjunction with FIG. 3, VSC 11 generates signal VLD with a voltage level that is proportional to the magnitude of negative supply voltage VBB.

Signal $VLD_O$ during burn-in mode operation is represented by a waveform 43. Before the voltage level of signal VLD (waveform 41) reaches the predetermined burn-in mode trip point of CBC 32, CBC 32 generates signal $VLD_O$ with a logic high level. However, when the voltage level of signal VLD reaches the predetermined burn-in mode switch level (indicated by point 44 on waveform 41), CBC 32 is configured to transition signal $VLD_O$ to a logic low level, as indicated by arrow 45. The logic low level of signal $VLD_O$ turns off charge pump 19 (FIG. 3), allowing the voltage levels of supply voltage VBB and signal VLD to remain roughly constant as indicated by portions $40_1$ and $41_1$ of waveforms 40 and 41. Of course, if the level of supply voltage VBB were to become less negative, then CBC 32 would transition signal $VLD_O$ to a logic high level to turn on charge pump 19 (FIG. 3) to pump supply voltage VBB to be more negative.

Signal $VLD_O$ during normal mode operation is represented by a waveform 47. Before the voltage level of signal VLD (waveform 41) reaches the predetermined normal mode trip point of CBC 32, CBC 32 generates signal $VLD_O$ with a logic high level. However, when the voltage level of signal VLD reaches the predetermined normal mode switch level (indicated by point 48 on waveform 41), CBC 32 is configured to transition signal $VLD_O$ to a logic low level, as indicated by arrow 49. The logic low level of signal $VLD_O$ turns off charge pump 19 (FIG. 3), allowing the voltage levels of supply voltage VBB and signal VLD to remain roughly constant as indicated by portions $40_2$ and $41_2$ of waveforms 40 and 41. Of course, if the level of supply voltage VBB were to become less negative, then CBC 32 would transition signal $VLD_O$ to a logic high level to turn on charge pump 19 (FIG. 3) to pump supply voltage VBB to be more negative.

As a result of these configurable switch thresholds, when in the normal mode, CBC 32 will generate signal $VLD_O$ so as to switch to a logic low level when negative supply voltage VBB reaches −1.5 volts, whereas in the burn-in mode, CBC 32 will generate signal $VLD_O$ so as to switch to a logic low level when negative supply voltage VBB reaches −1.0 volt.

Figure 5:
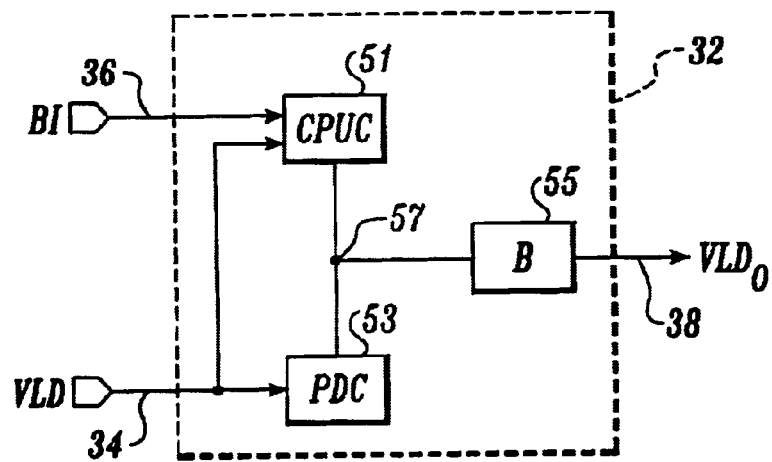
FIG. 5 is a functional block diagram illustrative of a CBC having a configurable pull-up circuit, according to one embodiment of the present invention.

FIG. 5 is a functional block diagram illustrative of one embodiment of CBC 32 (FIG. 3), according to the present invention. In this embodiment, CBC 32 includes a configurable pull up circuit (CPUC) 51, a pull-down circuit (PDC) 53 and an inverting buffer 55. More particularly, CPUC 51 has an input lead connected to lead 36 to receive signal BI, another input lead connected to lead 34 to receive signal VLD, and a pull-up lead connected to a node 57. PDC 53 has an input lead connected to lead 34 and a pull-down lead connected to node 57. Buffer 55 has an input lead connected to node 57 and an output lead connected to lead 38.

This embodiment of CBC 32 operates as follows. In response to signal BI, CPUC 51 is configured into either the normal mode or the burn-in mode. CPUC 51 and PDC 53 form, in effect, an inverter with a configurable switch threshold or trip point. In particular, CPUC 51 is configured to more strongly pull up the voltage at node 57 when in the burn-in mode than in the normal mode, thereby altering the switch threshold of the inverter. Consequently, when CBC 32 is in the burn-in mode, the relatively stronger pull up action of CPUC 51 causes the switch threshold or trip point to be at a relatively higher positive voltage level, thereby resulting in CBC 32 asserting active low signal $VLD_O$ at a relatively less negative value of supply voltage VBB. In this embodiment, CPUC 51 is configured so that in combination with PDC 53, this trip point is reached when supply voltage VBB has a level of −1.0 volt.

Thus, at power up in burn-in mode, supply voltage VBB has a value of about zero volts. Consequently, VSC 11 (FIG. 3) initially generates signal VLD with a logic high level, which causes CBC 32 to generate a logic low level signal at node 57. In response to the logic low level at node 57, inverting buffer 55 generates signal $VLD_O$ with a logic high level, thereby activating charge pump 19 (FIG. 3) to pump supply voltage VBB to be more negative. However, when the level of supply voltage VBB reaches −1.0 volt, CBC 32 "trips", thereby outputting a logic high level signal at node 57. The logic high level at node 57 causes inverting buffer 55 to generate signal $VLD_O$ with a logic low level, thereby de-activating charge pump 19 (FIG. 3).

Conversely, when CBC 32 is configured in the normal mode, the relatively weaker pull up action of CPUC 51 causes the switch threshold or trip point to be at a relatively lower positive voltage level, thereby resulting in CBC 32 asserting active low signal $VLD_O$ at a more negative value of supply voltage VBB. In this embodiment, CPUC 51 is configured so that in combination with PDC 53, this trip point is reached when supply voltage VBB has a level of −1.5 volts. As described above, once CPUC 51 is tripped, the logic low level of signal VLD generated by VSC 11 (FIG. 3) is propagated through CPUC 51 and buffer circuit 53 to de-activate charge pump 19 (FIG. 3).

Figure 6:
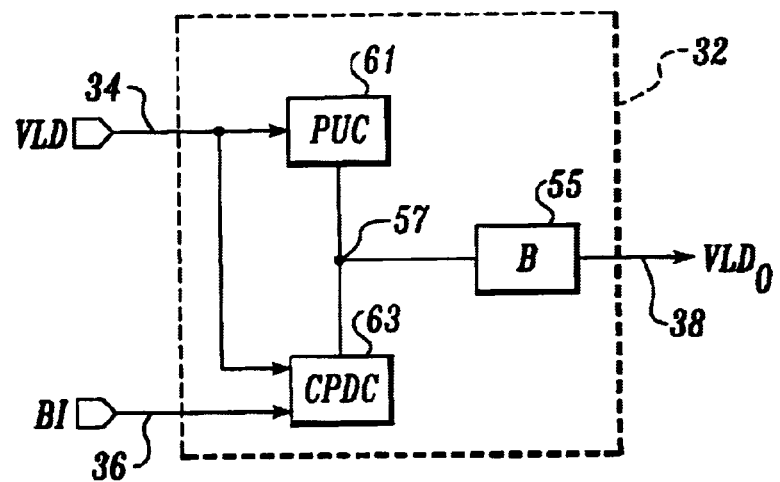
FIG. 6 is a functional block diagram illustrative of a CBC having a configurable pull-down circuit, according to one embodiment of the present invention.

FIG. 6 is a functional block diagram illustrative of one embodiment of CBC 32 (FIG. 3) having a pull-up circuit 61 and a configurable pull-down circuit (CPDC) 63, according to the present invention. This embodiment of CBC 32 is basically the converse of the embodiment of FIG. 5, with pull-up circuit (PUC) 61 and CPDC 63 respectively replacing CPUC 51 and PDC 53 (FIG. 5).

This embodiment of CBC 32 operates as follows. In response to signal BI CPDC 63 is configured into either the normal mode or the burn-in mode. CPDC 63 and PUC 61 form, in effect, an inverter with a configurable switch threshold or trip point. In particular, CPDC 63 is configured to less strongly pull down the voltage at node 57 when in the burn-in mode than in the normal mode, thereby altering the switch threshold of the inverter. Consequently, when CBC 32 is in the burn-in mode, the relatively weaker pull down action of CPDC 63 causes the switch threshold or trip point to be at a relatively higher positive voltage level, thereby resulting in CBC 32 asserting active low signal $VLD_O$ at a relatively less negative value of supply voltage VBB (i.e., −1.0 volt).

Conversely, when CBC 32 is configured in the normal mode, the relatively stronger pull down action of CPDC 63 causes the switch threshold or trip point to be at a relatively lower positive voltage level, thereby resulting in CBC 32 asserting active low signal $VLD_O$ at a relatively more negative value of supply voltage VBB (i.e., −1.5 volts).

Figure 7:
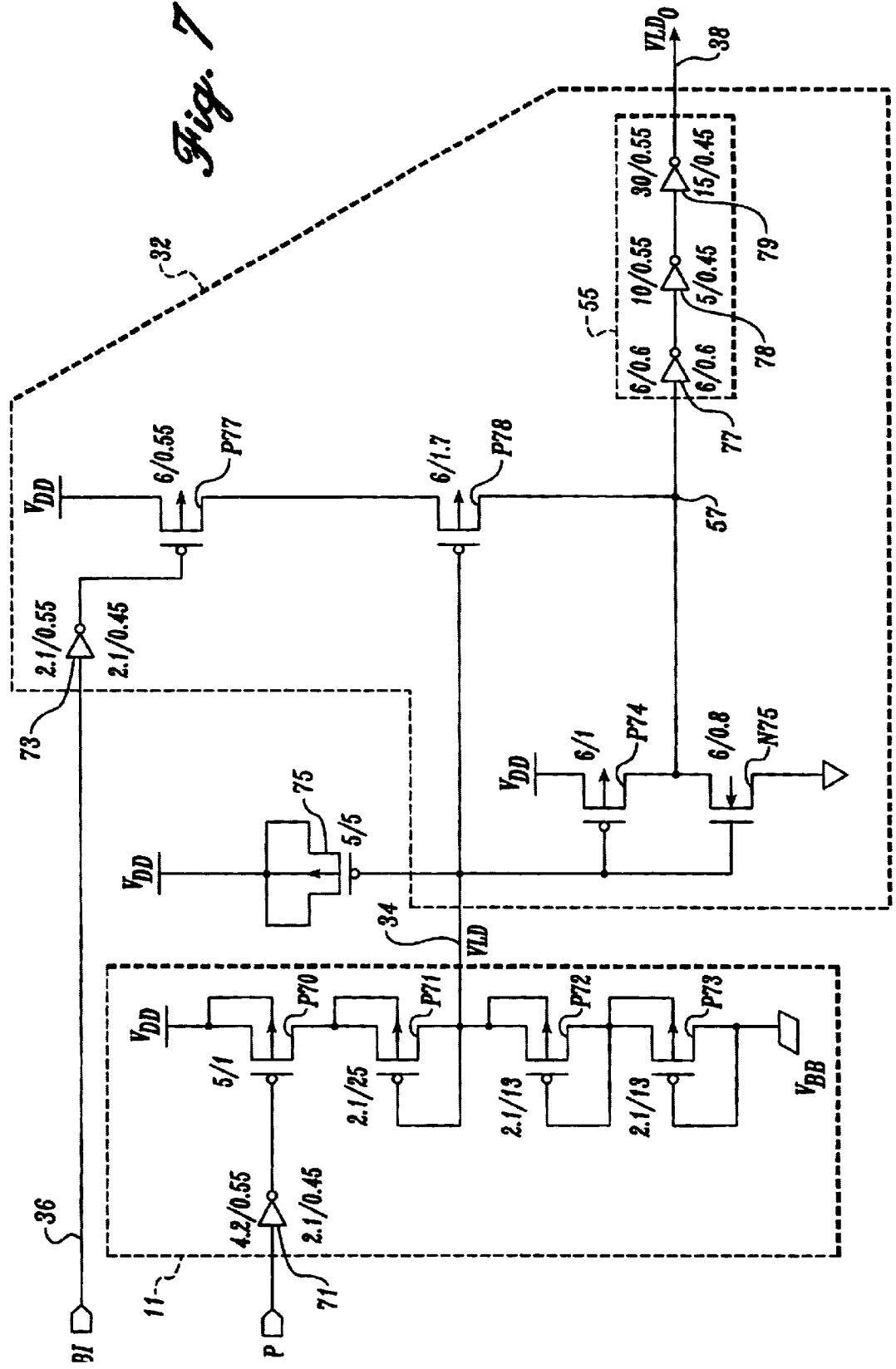
FIG. 7 is a schematic diagram illustrative of one implementation of the CBC of FIG. 5.

FIG. 7 is a schematic diagram illustrative of one implementation of CBC 32 (FIG. 5) having a configurable pull-up circuit. In addition, an embodiment of VSC 11 (FIG. 3) is also schematically shown. In this embodiment, VSC 11 includes P-channel field effect transistors (PFETs) P70–P73 and an inverter 71. PFETs P70–P73 are connected so that when turned on, their channel regions form a conductive path between a source of supply voltage VDD (e.g., a VDD bus) and a source of supply voltage VBB (e.g., a VBB bus). In particular, the gate of PFET P70 is connected to the output lead of inverter 71. The input lead of inverter 71 is connected to receive a low power control signal LP. Signal LP is generated by a control circuit (not shown) to configure the chip into a low power mode. When asserted, signal LP causes PFET P70 to be turned off, thereby interrupting the current path between the VDD bus and the VBB bus through PFETs P70–P73 to reduce power dissipation.

Referring again to PFET P70, the source and drain of PFET P70 are respectively connected to the VDD bus and the source of diode-connected PFET P71. The gate and drain of PFET P71 are connected to lead 34 and also to the source of diode-connected PFET P72. The gate and drain of PFET P72 are connected to the source of diode-connected PFET P73. The gate and drain of PFET P73 are connected to the VBB bus.

In this embodiment, CBC 32 includes an inverter 73, a capacitor 75, CPUC 51 (implemented by PFETs P74, P77 and P78), PDC 53 (implemented by N-channel field effect transistor or NFET N75) and inverting buffer circuit 55 (implemented by three cascaded inverters 77–79). Capacitor 75 is implemented with a PFET having its source and drain connected together to form a first capacitor electrode, with the gate serving as the second capacitor electrode.

CBC 32 is interconnected as follows. The first and second capacitor electrodes of capacitor 75 are respectively connected the VDD bus and lead 34. In addition, lead 34 is connected to the gates of FETs N75, P74 and P78. The source and drain of PFET P74 are respectively connected to the VDD bus and node 57. The source and drain of NFET N75 are respectively connected to a ground bus and node 57. In addition, node 57 is connected to the drain of PFET P78. The source of PFET P78 is connected to the drain of PFET P77. The gate and source of PFET P77 are respectively connected to the output lead of inverter 73 and the VDD bus. The input lead of inverter 73 is connected to receive signal BI.

This embodiment of CBC 32 operates as follows. VSC 11 is configured so that when supply voltages VBB and VDD are respectively at −1.5 volts and the normal mode VDD level, the voltage level at lead 34 will be about equal to the normal mode trip point of CBC 32. More specifically, the sizes of PFETs P70–P73 are predetermined so that the voltage drop across each of these PFETs results in the voltage level at lead 34 being at about the normal mode trip point of CBC 32 when the levels of supply voltages VBB and VDD respectively are about equal to −1.5 volts and the normal mode VDD level. The sizes of PFETs P70–P73 can be predetermined by modeling and simulation using conventional commercially-available modeling/simulation tools such as, for example, HSPICE. In addition, the sizes of these PFETs can be altered by means of spare devices that can be coupled to one or more of these PFETs through metal option.

FETs P74 and N75 essentially form a CMOS inverter, with a trip point that depends on their relative sizes. Generally, increasing the size (i.e., the width-to-length ratio) of the PFET pull-up device in effect increases the strength of the pull-up path, whereas increasing the size of the pull-down device generally increases the strength of the pull-down path. As is well known in the art of integrated circuits, increasing the strength of the pull-up path relative to the pull-down path raises the trip point of a CMOS inverter to a relatively higher positive voltage level, while increasing the strength of the pull-down path relative to the pull-up path lowers the trip point to a relatively less positive voltage level. This concept is used in the present invention to selectively alter the trip point of CBC 32 as follows.

PFETs P77 and P78 form a selectively activated pull-up path in parallel with PFET P74 to alter the strength of pull-up path of the inverter formed by CPUC 51 and PDC 53. In burn-in mode, signal BI is asserted, causing inverter 73 to provide a logic low level signal to PFET P77. Thus, the parallel pull-up path provided by PFETs P77 and P78 between the VDD bus and node 57 is enabled. As a result, the pull-up path is strengthened, thereby raising the trip point of the configurable inverter formed by CPUC 51 and PDC 53 (i.e., NFET N75). The sizes of PFETs P77 and P78 of CPUC 51 can be predetermined through modeling and simulation under burn-in conditions so as to achieve a trip point corresponding to supply voltage VBB being equal to −1.0 volt.

Figure 8:
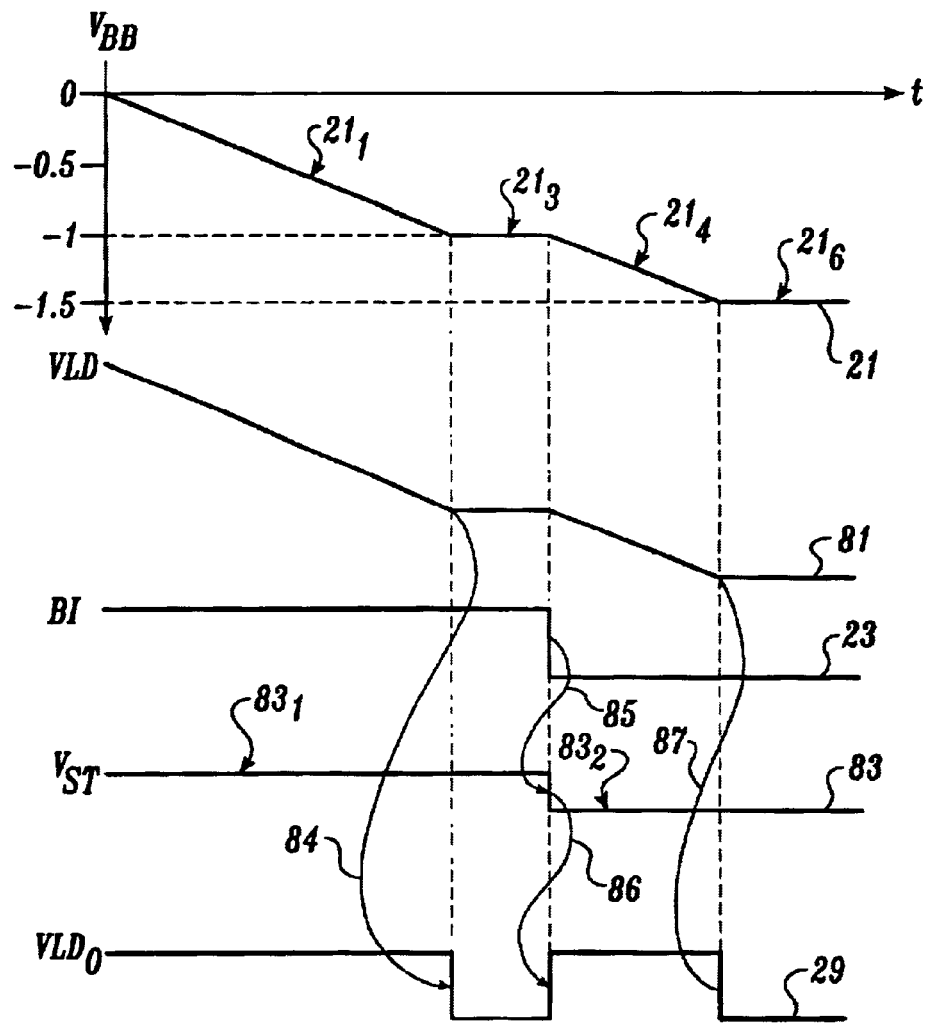
FIG. 8 is a timing diagram illustrative of the operation of the CBC of FIG. 7.

FIG. 8 is a timing diagram illustrative of the operation of the system depicted in FIG. 7. The voltage levels of signal VLD generated by VSC 11 and the configurable switch threshold ($V_{ST}$) of CBC 32 are respectively represented by waveform 81 and 83. Referring now to FIGS. 7 and 8, during power up in the burn-in mode, charge pump 19 (FIG. 3) pumps the level of supply voltage VBB to be more negative as indicated by arrow $21_1$ in FIG. 8. During the burn-in mode, CPUC 51 is configured to enable the parallel pull-up path formed by PFETs P77 and P78 so that $V_{ST}$ (i.e., the burn-in mode switch threshold or trip point) is at a relatively high level as indicated by arrow $83_1$. Thus, at this initial stage, the voltage level of signal VLD remains above the burn-in mode trip point of CBC 32, causing CBC 32 to generate signal $VLD_O$ with a logic high level.

When the level of supply voltage VBB reaches −1.0 volts, the level of signal VLD reaches the burn-in mode trip point of CBC 32, causing CBC 32 to generate signal $VLD_O$ with a logic low level to de-activate charge pump 19 (FIG. 3). Thus, the level of supply voltage VBB stays roughly constant at about −1.0 volt as indicated by arrow $21_3$.

In normal mode operation, signal BI is de-asserted. As a result, inverter 73 provides a logic high level signal to the gate of PFET P77. Consequently, PFET P77 is turned off, thereby disabling the pull-up path between the VDD bus and node 57 through PFETs P77 and P78. Thus, PFETs P77 and P78 are in effect isolated from node 57 and do not affect the trip point of CBC 32. Therefore, the trip point of CBC 32 depends essentially on FETs P74 and N75, without PFETs P77 and P78. In particular, the sizes of FETs P74 and N75 are predetermined in conjunction with the sizes of the PFETs of VSC 11 so as to achieve a trip point of CBC 32 that ideally is equal to the voltage level of signal VLD when the levels of supply voltages VBB and VDD are respectively equal to −1.5 volts and the normal mode VDD level.

Accordingly, when signal BI is de-asserted to configure CBC 32 into the normal mode, the parallel pull-up path formed by PFETs P77 and P78 in CPUC 51 is disabled as described above, thereby causing $V_{ST}$ to transition to a relatively low level, as indicated by arrows 85 and $83_2$ in FIG. 8. Because the trip point is lowered, CBC 32 causes a low-to-high transition of signal $VLD_O$ as indicated by arrow 86, thereby re-activating charge pump 19 (FIG. 3). As a result, the level of supply voltage VBB again begins to negatively increase as indicated by arrow $21_4$.

Figure 1:
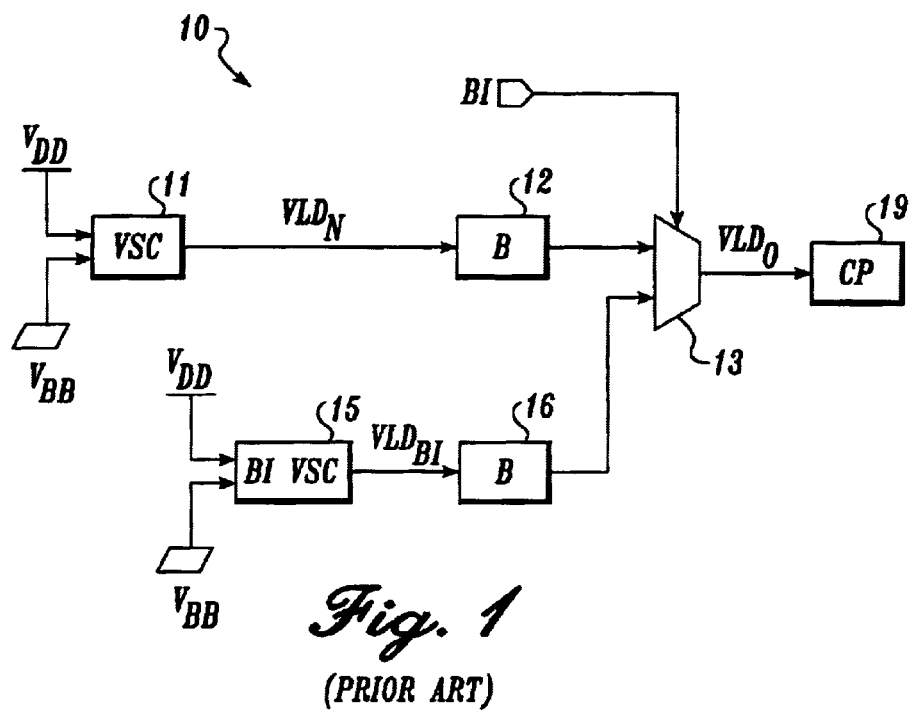
FIG. 1 is a functional block diagram illustrative of a conventional on-chip voltage generator system for adjusting an on-chip voltage generator for burn-in mode.
Figure 2:
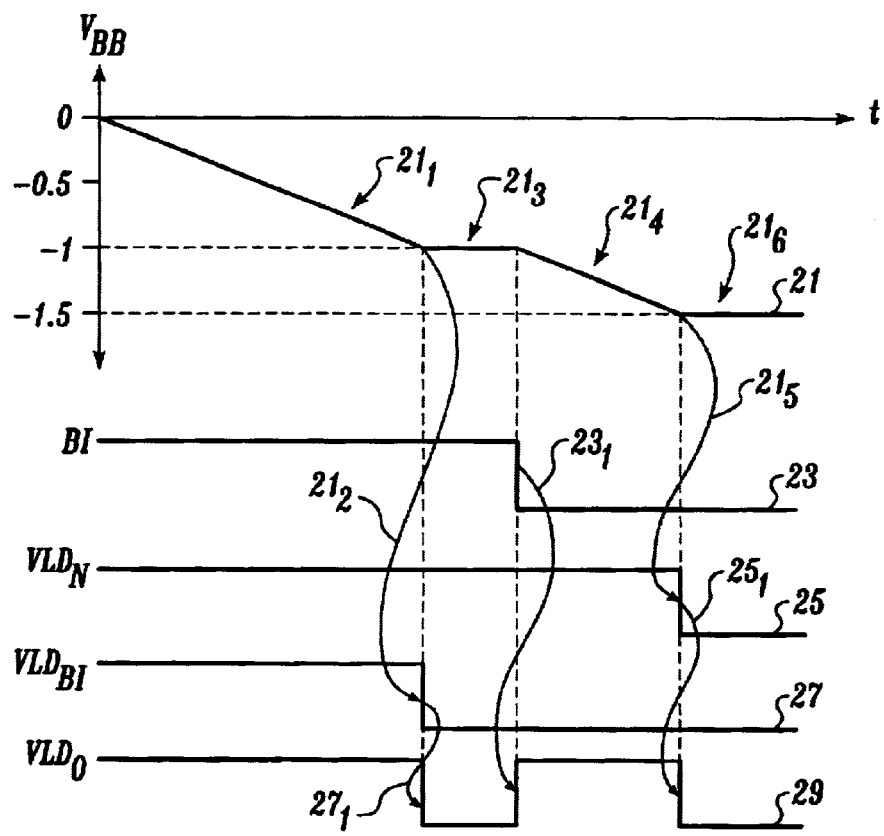
FIG. 2 is a timing diagram illustrative of the operation of the system of FIG. 1.

When the level of supply voltage VBB reaches −1.5 volts, the level of signal VLD reaches the normal mode trip point of CBC 32, causing CBC 32 to generate signal $VLD_O$ with a logic low level to de-activate charge pump 19 (FIG. 3). Thus, the level of supply voltage VBB stays roughly constant at about −1.5 volts as indicated by arrow $21_6$. Accordingly, CBC 32 generates signal $VLD_O$ to be essentially identical to signal $VLD_O$ as generated by system 10 (FIG. 1), but with less circuitry.

Figure 9:
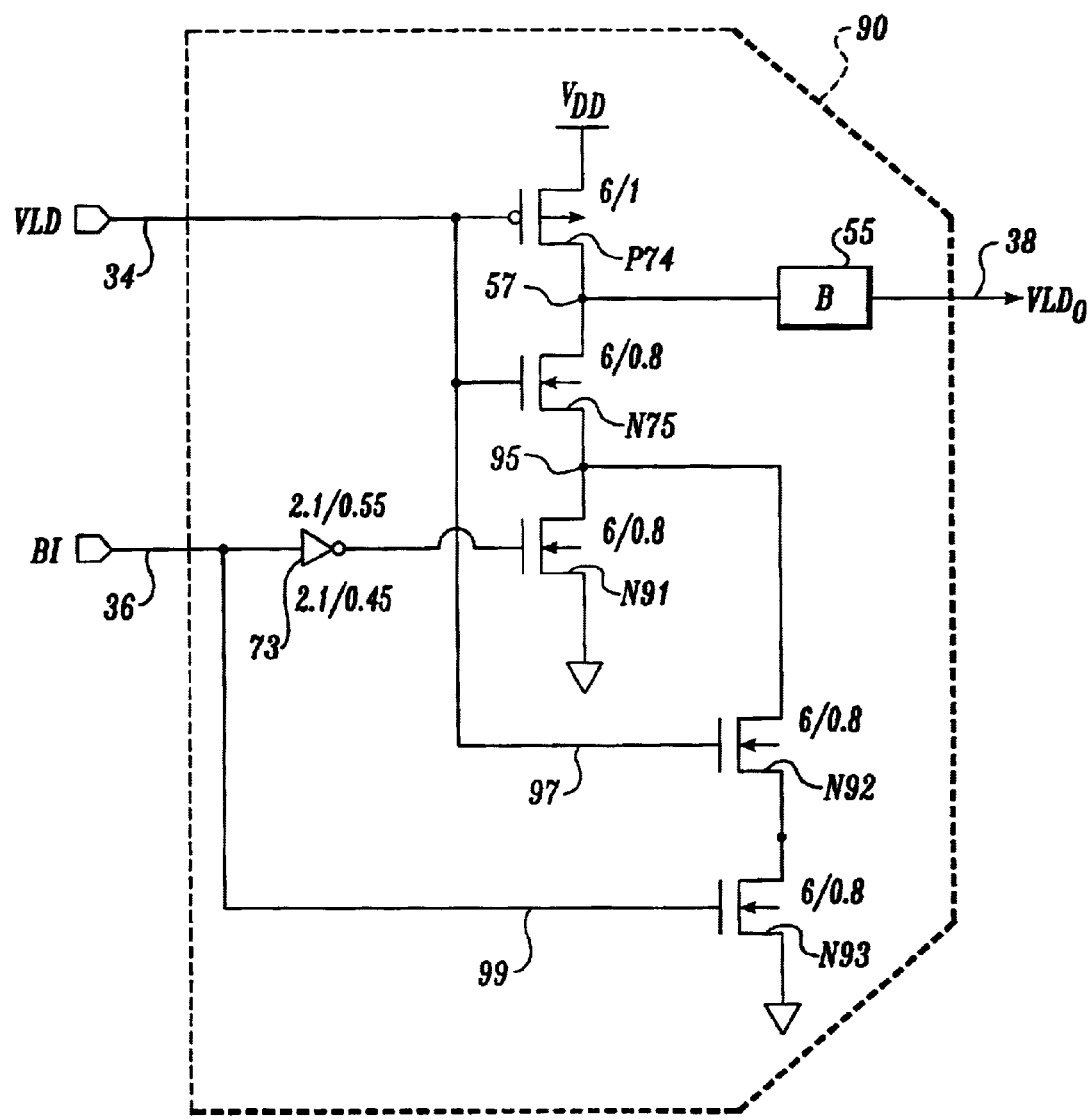
FIG. 9 is a schematic diagram illustrative of one implementation of the CBC of FIG. 6.

FIG. 9 is a schematic diagram illustrative of one implementation of a CBC 90 having a configurable pull-down circuit as described in conjunction with FIG. 6. In this embodiment, CBC 90 basically replaces CBC 32 (FIG. 7) and is different from CBC 32 in that the pull-down path is configurable instead of the pull-up path. However, the same basic concept is used; i.e., increasing the strength of the pull-up path relative to the pull-down path raises the trip point of a CMOS inverter circuit to a relatively higher positive voltage level, while increasing the strength of the pull-down path relative to the pull-up path lowers the trip point to a relatively less positive voltage level.

This embodiment of CBC 90 includes inverting buffer 55, CPDC 63 (implemented by NFETs N75, N91–N93) and PUC 61 (implemented by PFET P74). Unlike in the embodiment of FIG. 7, the source of NFET N75 is connected to a node 95 instead of the ground bus. Node 95 is also connected to the drains of NFETs N91 and N92. In addition, unlike CBC 32 (FIG. 7), the output lead of inverter 73 is connected to the gate of NFET N91 instead of PFET P77, which is deleted from CBC 90 along with PFET P78, CBC 90 is further interconnected as follows. The source of NFET N91 is connected to the ground bus. The gate and source of NFET N92 are respectively connected to lead 34 to receive signal VLD and the drain of NFET N93. The gate and source of NFET 93 are respectively connected to lead 36 to receive signal BI and the ground bus.

Unlike CBC 32 (FIG. 7), this embodiment alters the strength of the configurable path by changing the "effective" channel length of the path instead of enabling/disabling a parallel path. Of course, the parallel path method may be used in different embodiments of CPDC 63 and, conversely, the configurable channel length method may be used in other embodiments of CPUC 51 (FIG. 5). CBC 90 may have slightly different switch thresholds or trip points than CBC 32 (FIG. 7) and, therefore, the sizes of the PFETs in VSC 11 (FIG. 7) may need to slightly changed so as to achieve the appropriate trip points for CBC 90.

More specifically, in the burn-in mode, signal BI is asserted, thereby directly turning on NFET N93 while turning off NFET N91 via inverter 73. As a result, during the burn-in mode, NFETs N75, N92 and N93 form the pull-down path. This three device pull-down path has a relatively long effective channel length. Thus, the burn-in mode pull-down path is relatively weak thereby causing the trip point of CBC 90 to be at a relatively high positive voltage level.

Conversely, in the normal mode, signal BI is de-asserted, thereby turning on NFET N91 via inverter 73 while directly turning off NFET N93. As a result, during the normal mode, NFETs N75 and N91 form the pull-down path. This two device pull-down path has a relatively short effective channel length. Thus, the normal mode pull-down path is relatively strong, thereby causing the trip point of CBC 90 to be at a relatively low positive voltage level. Accordingly, in response to signals VLD and BI, CBC 90 provides essentially the same function as CBC 32 (FIG. 7) in generating signal $VLD_O$.

The embodiments of the adjustable on-chip voltage generation circuit described above are illustrative of the principles of the present invention and are not intended to limit the invention to the particular embodiments described. For example, in light of the present disclosure, those skilled in the art of integrated circuit design can devise other implementations for use with different supply voltages and supply voltage levels, including positive supply voltages, without undue experimentation. Also, voltage sensing circuits different from the types described can be used in other embodiments. In addition, those skilled in the art of logic circuits can implement equivalent logic for CBC 32 or CBC 90 adapted for use with control signals having polarities (i.e., being active high instead of active low or vice versa) that are different from the control signals described (e.g., signal BI). Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An on-chip circuit for controlling the activation of an on-chip voltage generator of a chip that provides an on-chip generated voltage having a voltage level, the on-chip voltage generator being activated as a function of the logic level of a control signal, the chip being configurable into a plurality of operational modes, the circuit comprising:
   a voltage sensing circuit coupled to monitor the on-chip generated voltage, wherein the voltage sensing circuit is configured to generate a voltage sense signal having a level that is a function of the voltage level of the on-chip generated voltage; and
   a buffer circuit coupled to the voltage sensing circuit and the on-chip voltage generator, the buffer circuit having a configurable switch threshold, wherein the buffer circuit is configured to generate the control signal with a logic level that is a function of the level of the voltage sense signal and the configurable switch threshold, the control signal being received by the voltage generator and, in response to a logic level of the control signal, the voltage generator is activated and de-activated.

2. The circuit of claim 1 wherein the buffer circuit is configured to adjust the configurable switch threshold to a predetermined threshold corresponding to a selected operational mode of the plurality of operational modes so that the control signal is generated to control the activation and de-activation of the on-chip voltage generator to maintain the on-chip generated voltage to be at a predetermined voltage level corresponding to the selected operational mode.

3. The circuit of claim 1 wherein an operational mode of the plurality of operational modes is selected in response to a mode control signal.

4. The circuit of claim 1 wherein the buffer circuit comprises a pull-up path and is further configured to alter the strength of the pull-up path in response to the control signal.

5. The circuit of claim 1 wherein the pull-up path is strengthened by enabling a pull-up device in response to the control signal.

6. The circuit of claim 1 wherein the buffer circuit comprises a pull-down path and is further configured to alter the strength of the pull-down path in response to the control signal.

7. The circuit of claim 6 wherein the pull-down path is weakened by lengthening the pull-down path.

8. A method of controlling the activation of an on-chip voltage generator that provides an on-chip generated voltage having a voltage level, the on-chip voltage generator being activated as a function of the logic level of a control signal, the chip being configurable into at least a first operational mode and a second operational mode, the method comprising:
   monitoring the voltage level of the on-chip generated voltage using a single monitoring circuit;
   generating a voltage sense signal having a level that is a function of the voltage level of the on-chip generated voltage;
   setting a switch threshold to a first predetermined threshold corresponding to the first operational mode;

generating the control signal with a logic level that is a function of the level of the voltage sense signal and the first predetermined threshold, wherein responsive to the control signal the on-chip voltage generator is controlled so as to maintain the on-chip generated voltage at a first predetermined voltage level corresponding to the first operational mode;

altering the switch threshold to a second predetermined threshold corresponding to the second operational mode, said first and second predetermined thresholds being different;

generating the control signal with a logic level that is a function of the level of the voltage sense signal and the second predetermined threshold, wherein responsive to the control signal the on-chip voltage generator is controlled so as to maintain the on-chip generated voltage at a second predetermined voltage level corresponding to the second operational mode, the second predetermined voltage level being different from the first predetermined voltage level.

9. The method of claim 8 wherein the first predetermined voltage level has a larger magnitude than the second predetermined voltage level.

10. The method of claim 9 wherein the first and second predetermined voltage levels are negative.

11. The method of claim 10 wherein the first and second predetermined thresholds are voltage levels, the voltage level of the second predetermined threshold being greater than the voltage level of the first predetermined threshold.

12. The method of claim 10 wherein the level of the voltage sense signal is a positive voltage level that is proportional to a magnitude of the voltage level of the on-chip generated voltage.

13. The method of claim 8 wherein the chip is configured into either the first or second operational modes in response to a mode control signal.

14. The method of claim 13 wherein adjusting the switch threshold comprises altering the strength of a pull-down path in a circuit in response to the control signal, the circuit being coupled to receive the voltage sense signal.

15. The method of claim 13 wherein adjusting the switch threshold comprises altering the strength of a pull-up path in a circuit in response to the control signal, the circuit being coupled to receive the voltage sense signal.

16. The method of claim 15 wherein the pull-up path is strengthened by enabling a pull-up device in response to the control signal.

17. The method of claim 15 wherein the pull-up path is weakened by increasing effective device length in the pull-up path.

18. An apparatus for controlling the activation of an on-chip voltage generator of a chip that provides an on-chip generated voltage having a voltage level, the on-chip voltage generator being activated as a function of the logic level of a control signal, the chip being configurable into at least a first operational mode and a second operational mode, the apparatus comprising:

means for generating a voltage sense signal having a level that is a function of the voltage level of the on-chip generated voltage;

means for selectively configuring the chip into the first operational mode and for selectively configuring the chip into the second operational mode;

means for selectively adjusting a configurable switch threshold to a first predetermined threshold corresponding to the first operational mode and to a second predetermined threshold corresponding to the second operational mode;

means for generating the control signal wherein:
when the chip is configured in the first operational mode, the control signal has a logic level that is a function of the level of the voltage sense signal and the first predetermined threshold, wherein responsive to the control signal the on-chip voltage generator is controlled so as to maintain the on-chip generated voltage at a first predetermined voltage level corresponding to the first operational mode, and when the chip is configured in the second operational mode, the control signal has a logic level that is a function of the level of the voltage sense signal and the second predetermined threshold, wherein responsive to the control signal the on-chip voltage generator is controlled so as to maintain the on-chip generated voltage at a second predetermined voltage level corresponding to the second operational mode.

19. The apparatus of claim 18 wherein the level of the voltage sense signal is a positive voltage level that is proportional to a magnitude of the voltage level of the on-chip generated voltage.

20. The apparatus of claim 18 wherein an operational mode of the plurality of operational modes is selected in response to a mode control signal.

21. The apparatus of claim 20 wherein the means for selectively adjusting comprises a pull-up path and is further configured to alter the strength of the pull-up path in response to the control signal.

22. The apparatus of claim 20 wherein the means for selectively adjusting comprises a pull-down: path and is further configured to alter the strength of the pull-down path in response to the control signal.

23. The apparatus of claim 22 wherein the pull-down path is strengthened by enabling a pull-down device in response to the control signal.

24. The apparatus of claim 22 wherein the pull-down path is weakened by increasing the effective device length in the pull-down path.

* * * * *